US008637924B2

(12) United States Patent
Hirler et al.

(10) Patent No.: US 8,637,924 B2
(45) Date of Patent: Jan. 28, 2014

(54) LATERAL TRENCH MESFET

(75) Inventors: Franz Hirler, Isen (DE); Andreas Peter Meiser, Sauerlach (DE)

(73) Assignee: Infineon Technologies Austria AG, Villach (AT)

( * ) Notice: Subject to any disclaimer, the term of this patent is extended or adjusted under 35 U.S.C. 154(b) by 126 days.

(21) Appl. No.: 13/172,022

(22) Filed: Jun. 29, 2011

(65) Prior Publication Data

US 2012/0305932 A1 Dec. 6, 2012

Related U.S. Application Data

(63) Continuation-in-part of application No. 13/152,477, filed on Jun. 3, 2011.

(51) Int. Cl.
*H01L 29/66* (2006.01)
(52) U.S. Cl.
USPC ..... 257/330; 257/141; 257/343; 257/E27.023
(58) Field of Classification Search
USPC .............................. 257/141, 330, 343, E27.023
See application file for complete search history.

(56) References Cited

U.S. PATENT DOCUMENTS

| 4,839,310 | A | | 6/1989 | Hollis et al. | |
|---|---|---|---|---|---|
| 5,406,094 | A | * | 4/1995 | Arimoto et al. | 257/24 |
| 2010/0012952 | A1 | * | 1/2010 | Saxler et al. | 257/77 |
| 2010/0072407 | A1 | | 3/2010 | Shur et al. | |
| 2011/0006308 | A1 | | 1/2011 | Sato | |
| 2012/0270378 | A1 | | 10/2012 | Kittler et al. | |

FOREIGN PATENT DOCUMENTS

WO 2011051499 A1 5/2011

* cited by examiner

*Primary Examiner* — Tan N Tran
(74) *Attorney, Agent, or Firm* — Murphy, Bilak & Homiller, PLLC

(57) ABSTRACT

A transistor includes a trench formed in a semiconductor body, the trench having sidewalls and a bottom. The transistor further includes a first semiconductor material disposed in the trench adjacent the sidewalls and a second semiconductor material disposed in the trench and spaced apart from the sidewalls by the first semiconductor material. The second semiconductor material has a different band gap than the first semiconductor material. The transistor also includes a gate material disposed in the trench and spaced apart from the first semiconductor material by the second semiconductor material. The gate material provides a gate of the transistor. Source and drain regions are arranged in the trench with a channel interposed between the source and drain regions in the first or second semiconductor material so that the channel has a lateral current flow direction along the sidewalls of the trench.

23 Claims, 21 Drawing Sheets

LATERAL TRENCH MESFET

PRIORITY CLAIM

This application is a continuation-in-part of co-pending U.S. patent application Ser. No. 13/152,477 filed 3 Jun. 2011, the content of said application incorporated herein by reference in its entirety.

FIELD OF TECHNOLOGY

The present application relates to semiconductor devices, in particular lateral trench MESFETs.

BACKGROUND

MESFETs (metal semiconductor field effect transistors) include a conducting channel positioned between source and drain contact regions. The carrier flow from the source to drain is controlled by a Schottky metal gate. The channel is controlled by varying the depletion layer width underneath the metal contact which modulates the thickness of the conducting channel and thereby the current. MESFETs require a relatively low on resistance (Ron) to achieve good performance. In addition, the blocking capability of GaN MESFETs on Si substrates is limited by the thickness of the GaN layer because accumulation of charge carriers occurs in Si on the boundary surface between GaN and the substrate and thus cannot dissipate any voltage. However, the thickness of the GaN layer is limited because of the change in stress from GaN to Si.

Current power transistors based on GaN are constructed mostly as HEMTs (high electron mobility transistors) which are also known as heterostructure FETs (HFETs) or modulation-doped FETs (MODFETs). An HEMT is a field effect transistor with a junction between two materials having different band gaps such as GaN and AlGaN which forms the channel instead of a doped region such as in a MOSFET (metal oxide semiconductor field effect transistor). HEMTs provide a 2-dimensional electron gas (2DEG) which is formed on the boundary between e.g. an AlGaN barrier layer and a GaN buffer layer. Without further measures, such a construction leads to a self-conducting i.e. normally on transistor. That is, the HEMT conducts in the absence of a positive gate voltage.

The conductive band can be raised in such a way e.g. with a p-type AlGaN or p-type GaN layer under the gate electrode which shifts the resulting applied voltage in comparison to a device without such a p-type layer by about 3V (equivalent to the band distance) in the positive direction. An HEMT with such a construction is a normally off transistor in that a positive gate voltage is needed to switch on the transistor. Alternatively, a recessed gate structure can be used to ensure the HEMT functions as a normally off transistor.

In each case, inexpensive silicon substrates are typically used to fabricate an HEMT. However, for high voltages of more than 100 V, the entire voltage must be absorbed in the thickness of the GaN layer because the substrate cannot dissipate any voltage as described above. HEMTs also typically have a planar gate structure, limiting the channel width.

SUMMARY

According to an embodiment of a transistor, the transistor includes a trench formed in a semiconductor body, the trench having sidewalls and a bottom. The transistor further includes a first semiconductor material disposed in the trench adjacent the sidewalls and a second semiconductor material disposed in the trench and spaced apart from the sidewalls by the first semiconductor material. The second semiconductor material has a different band gap than the first semiconductor material. The transistor also includes a gate material disposed in the trench and spaced apart from the first semiconductor material by the second semiconductor material. The gate material provides a gate of the transistor. Source and drain regions are arranged in the trench with a channel interposed between the source and drain regions in the first or second semiconductor material so that the channel has a lateral current flow direction along the sidewalls of the trench.

According to an embodiment of a method of manufacturing a transistor, the method includes: forming a trench in a semiconductor body, the trench having sidewalls and a bottom; forming a first semiconductor material adjacent the trench sidewalls; forming a second semiconductor material in the trench which is spaced apart from the sidewalls by the first semiconductor material, the second semiconductor material having a different band gap than the first semiconductor material; forming a gate material in the trench which is spaced apart from the first semiconductor material by the second semiconductor material, the gate material providing a gate of the transistor; and forming source and drain regions in the trench with a channel interposed between the source and drain regions in the first or second semiconductor material so that the channel has a lateral current flow direction along the sidewalls of the trench.

According to an embodiment of a semiconductor device, the device includes a plurality of trenches formed in a semiconductor body, each trench having sidewalls and a bottom. The device further includes a first semiconductor material disposed adjacent the sidewalls of each trench and a second semiconductor material disposed on the first semiconductor material in each trench. The second semiconductor material has a different band gap than the first semiconductor material. The device also includes a gate material disposed on the second semiconductor material in each trench. A channel in the first or second semiconductor material has a lateral current flow direction along the sidewalls of each trench.

According to an embodiment of a method of manufacturing a semiconductor device, the method includes: forming a plurality of trenches in a semiconductor body, each trench having sidewalls and a bottom; forming a first semiconductor material adjacent the sidewalls of each trench; forming a second semiconductor material on the first semiconductor material in each trench, the second semiconductor material having a different band gap than the first semiconductor material; and forming a gate material disposed on the second semiconductor material in each trench so that a channel in the first or second semiconductor material has a lateral current flow direction along the sidewalls of each trench.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

A number of embodiments are explained next. Identical structural features are identified by identical or similar reference symbols in the Figures. In the context of the present description, "lateral" or "lateral direction" should be understood to mean a direction or extent that runs generally parallel to the lateral extent of a semiconductor material or semiconductor body. The lateral direction thus extends generally parallel to these surfaces or sides. In contrast thereto, the term "vertical" or "vertical direction" is understood to mean a direction that runs generally perpendicular to these surfaces or sides and thus generally perpendicular to the lateral direction. The vertical direction therefore runs in the thickness direction of the semiconductor material or semiconductor body.

Figure 1:
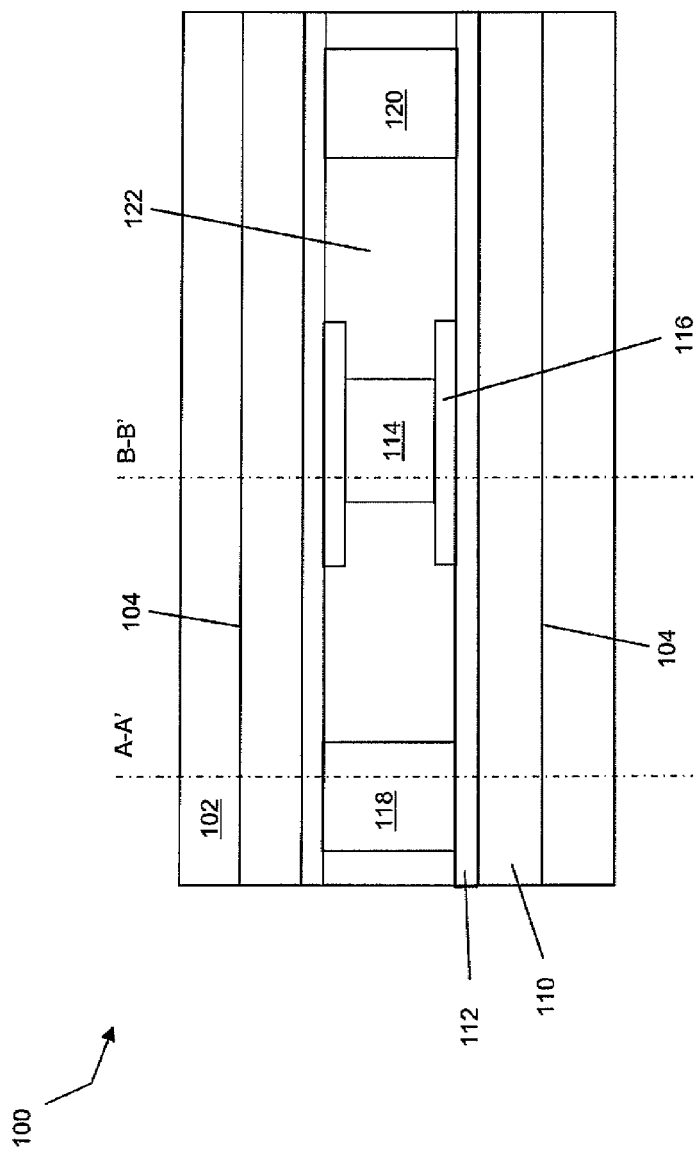
FIG. 1 illustrates a partial schematic plan view of a lateral trench MESFET according to an embodiment.
Figure 2:
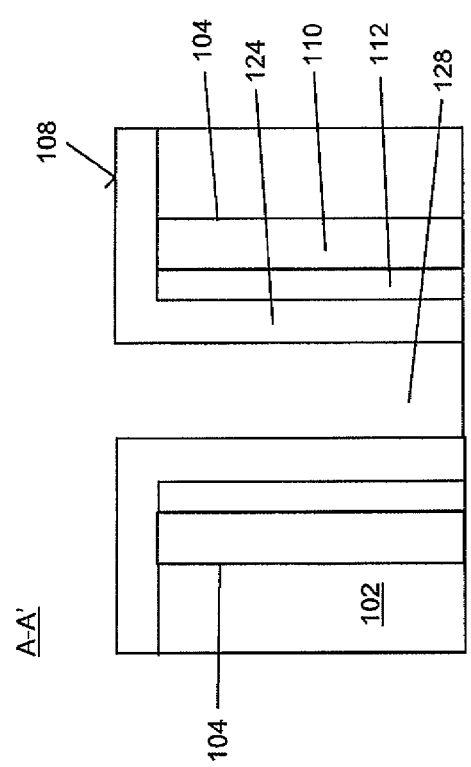
FIG. 2 illustrates a first schematic cross-sectional view of the lateral trench MESFET of FIG. 1.
Figure 3:
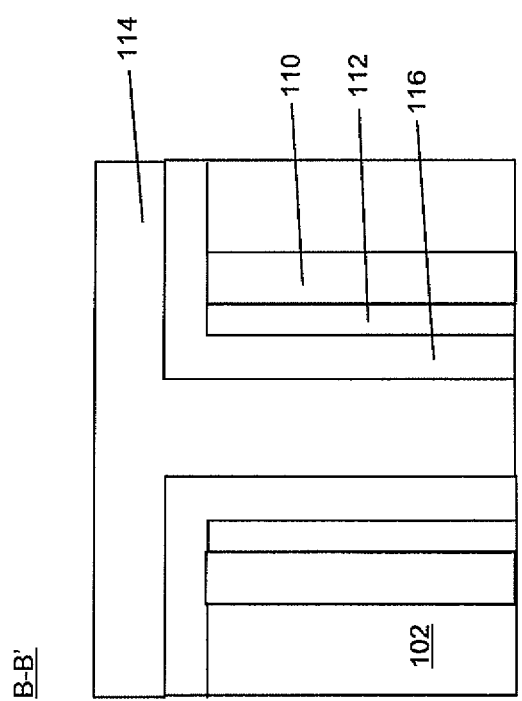
FIG. 3 illustrates a second schematic cross-sectional view of the lateral trench MESFET of FIG. 1.
Figure 4:
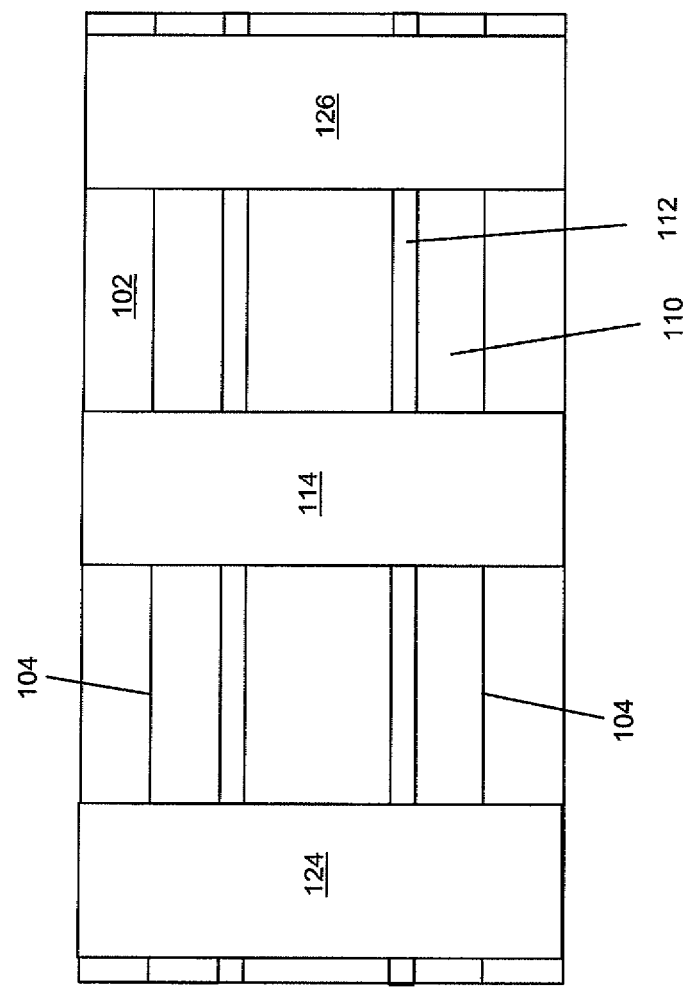
FIG. 4 illustrates a partial schematic plan view of the lateral trench MESFET of FIG. 1 with electrodes.

FIG. 1 illustrates a partial plan view of an embodiment of a MESFET such as a normally-off HEMT. The HEMT is considered to be normally-off because the device has a positive threshold voltage. FIG. 2 shows a cross-sectional view of the source region of the HEMT through the line labeled A-A' in FIG. 1, FIG. 3 shows a cross-sectional view of the gate region of the HEMT through the line labeled B-B' in FIG. 1, and FIG. 4 shows a partial plan view of the HEMT with gate, drain and source electrodes.

The HEMT is provided in a trench 100 formed in a semiconductor body 102 such as a Si, SOI (silicon on insulator) GaN, SiC, or sapphire substrate. The trench structures described herein can be combined with several MESFET structures, such as for example with a thin AlGaN or GaN barrier layer under a gate or for a MOSFET. Also, the MESFET can be formed on the sidewall of the trench also for a vertical current flow and the source or the drain can be formed on the rear wall. In each case, the trench 100 can be etched into the semiconductor body 102. The trench 100 has sidewalls 104 and a bottom 106 which is out of view in FIG. 1-4.

The trench 100 extends from a topside 108 of the semiconductor body 102 to a depth in the semiconductor body 102. The HEMT includes a buffer layer 110 of III-V semiconductor material such as GaN disposed in the trench 100 adjacent the sidewalls 104, and a barrier layer 112 of III-V semiconductor material such as AlGaN, i-AlGaN (intrinsic AlGaN), InAlN or i-InAlN (intrinsic InAlN) disposed in the trench 100 and spaced apart from the sidewalls 104 by the buffer layer 110.

The barrier layer 112 has a different band gap than the buffer layer 110. The buffer layer 110 or the barrier layer 112 provides a channel (inversion layer) near the interface between the buffer layer 110 and the barrier layer 112. The channel is supplied with charge for a 2-D electron gas (2DEG). The channel is automatically created via strain and polarization effects without the application of any voltage to the gate electrode 114. A gate layer 116 of III-V semiconductor material such as p-AlGaN (p-type AlGaN) or p-GaN (p-type GaN) is disposed in the trench 100 and spaced apart from the buffer layer 110 by the barrier layer 112. The gate layer 116 depletes the inversion layer in the gate region, shifting the threshold voltage to positive values in this section of the channel. As such, the HEMT is considered to be normally off. The gate layer 116 provides the gate of the HEMT and is not present in the source, drain and drift regions 118, 120, 122 of the HEMT. The source, drain and drift regions 118, 120, 122 are also arranged in the trench 100 with the channel interposed between the source and drain regions 118, 120. An optional filler material 128 such as a dielectric can be provided in the trench 100 at the source, drain and/or drift regions 118, 120, 122. The channel has a lateral current flow direction along the sidewalls 104 of the trench 100 between the source and drain regions 118, 120.

In one embodiment, the sidewalls 104 of the trench 100 are preferably formed with a (111) surface. Growth of the buffer layers 110 then occurs, as well as that of the barrier layer 112 and gate layer 116 similarly to planar surfaces. The gate electrode 114 is then electrically connected to the gate layer 116 in the trench 100 so that the trench 100 is at least partially filled. In one embodiment, the gate electrode 114 is blanket deposited and then etched away in the region of the source, drain and drift regions 118, 120, 122. The source and drain electrodes 124, 126 or possibly also the gate electrode 114 can be selectively formed and structured. The source and drain electrodes 124, 126 can be disposed on the same side of the semiconductor body 102 as shown in FIG. 4 or on different sides.

A lateral current flows in the 2DEG along the trench sidewalls 104 between the source and drain regions 118, 120. The lateral current can also flow at the bottom 106 of the trench 100 and/or above the trench 100 along the topside 108 of the semiconductor body 102 if the buffer, barrier and gate layers 110, 112, 166 are formed in these regions. Alternatively, the buffer, barrier and/or gate layers 110, 112, 116 may be removed from the trench bottom 106 and/or along the topside 108 of the semiconductor body 102. In each case, the width of the channel is significantly increased by such folding when compared to conventional HEMTs, yielding a lower on resistance (Ron).

Figure 5:
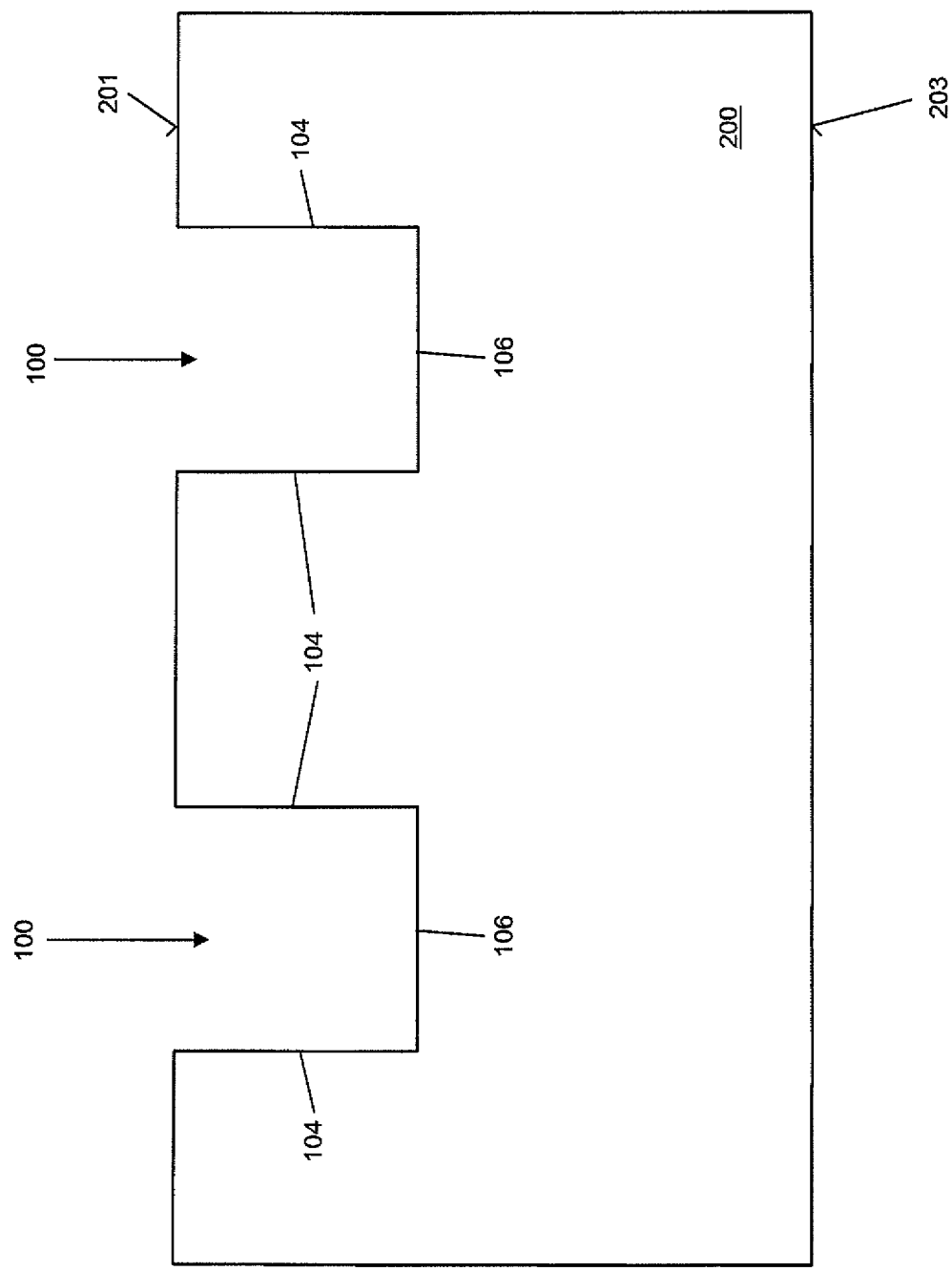
FIGS. 5-8 illustrate an embodiment of a method of manufacturing a lateral HEMT in a trench.
Figure 6:
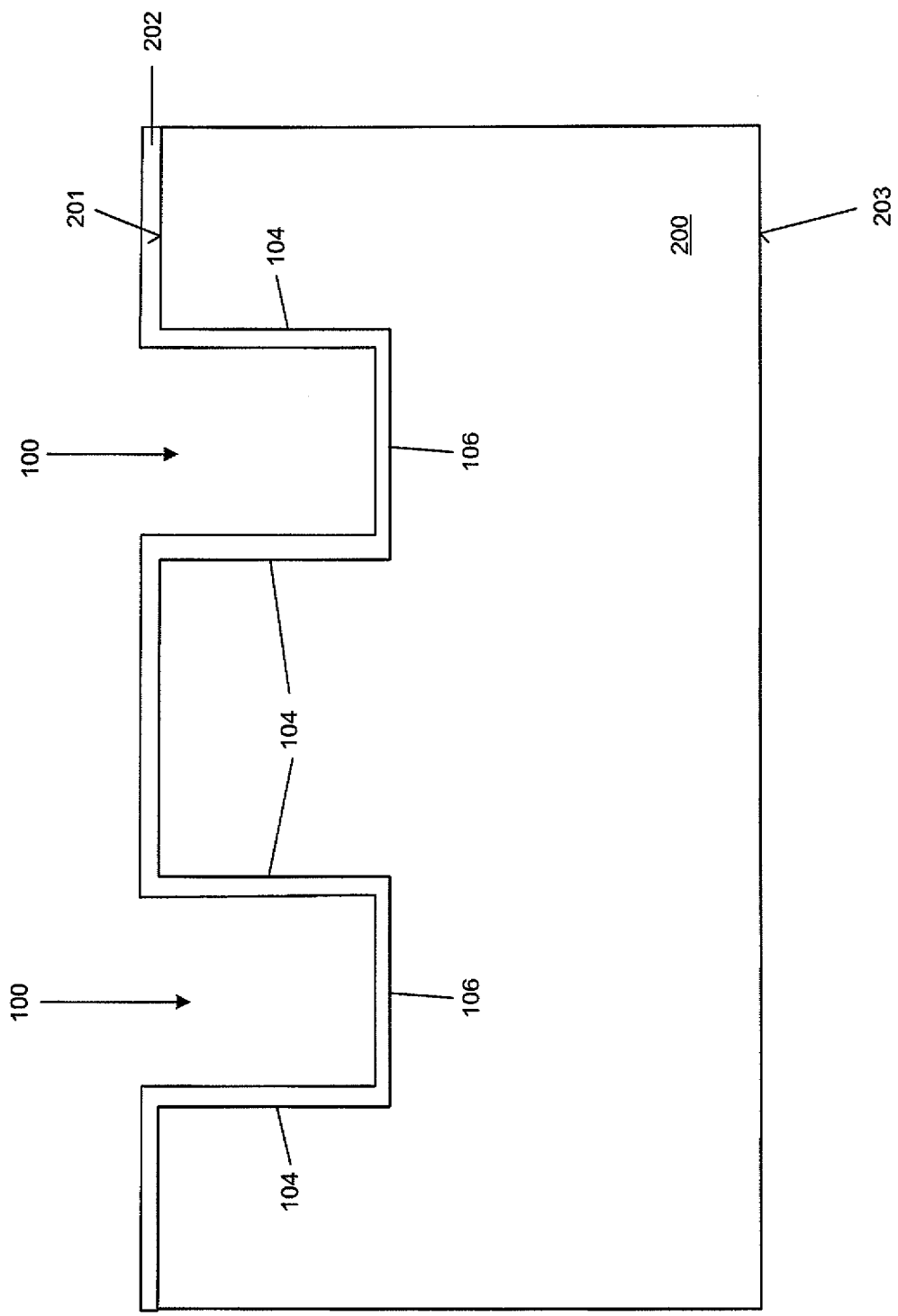
Figure 7:
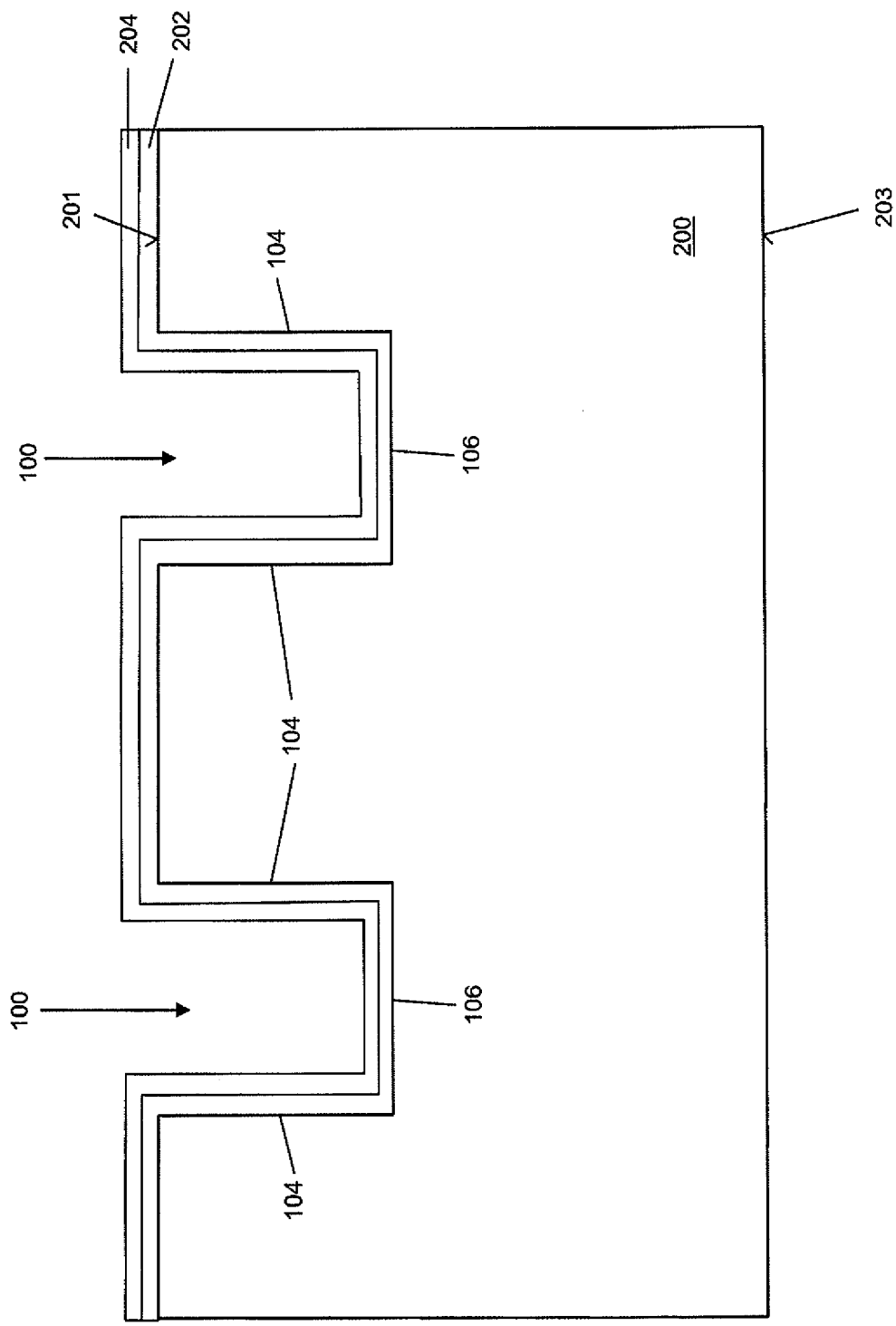

FIGS. 5-8 illustrate one embodiment of a method for manufacturing a lateral HEMT in a trench. Trenches 100 are formed in a semiconductor substrate 200 such as a Si substrate as shown in FIG. 5, each trench 100 having sidewalls 104 and a bottom 106. A first region of III-V semiconductor material 202 such as GaN is formed in the trenches 100 along the sidewalls 104 and bottom 106, and on the topside 201 of the Si substrate 200 as shown in FIG. 6. The first region of III-V semiconductor material 202 forms the buffer layer and can include the channel of the HEMT. The first region of III-V semiconductor material 202 can be formed via any suitable conventional technique e.g. via heteroepitaxy on a compatible substrate such as Si, sapphire, GaN or SiC. A second region of III-V semiconductor material 204 such as AlGaN or InAlN is then formed in the trenches 100 on the first (buffer) region 202 via any suitable conventional technique e.g. via epitaxy as shown in FIG. 7. The second region 204 forms the barrier layer of the HEMT which supplies charge for the 2DEG in the channel. The second (barrier) region 204 has a different band gap than the first (buffer) region 202.

Figure 8:
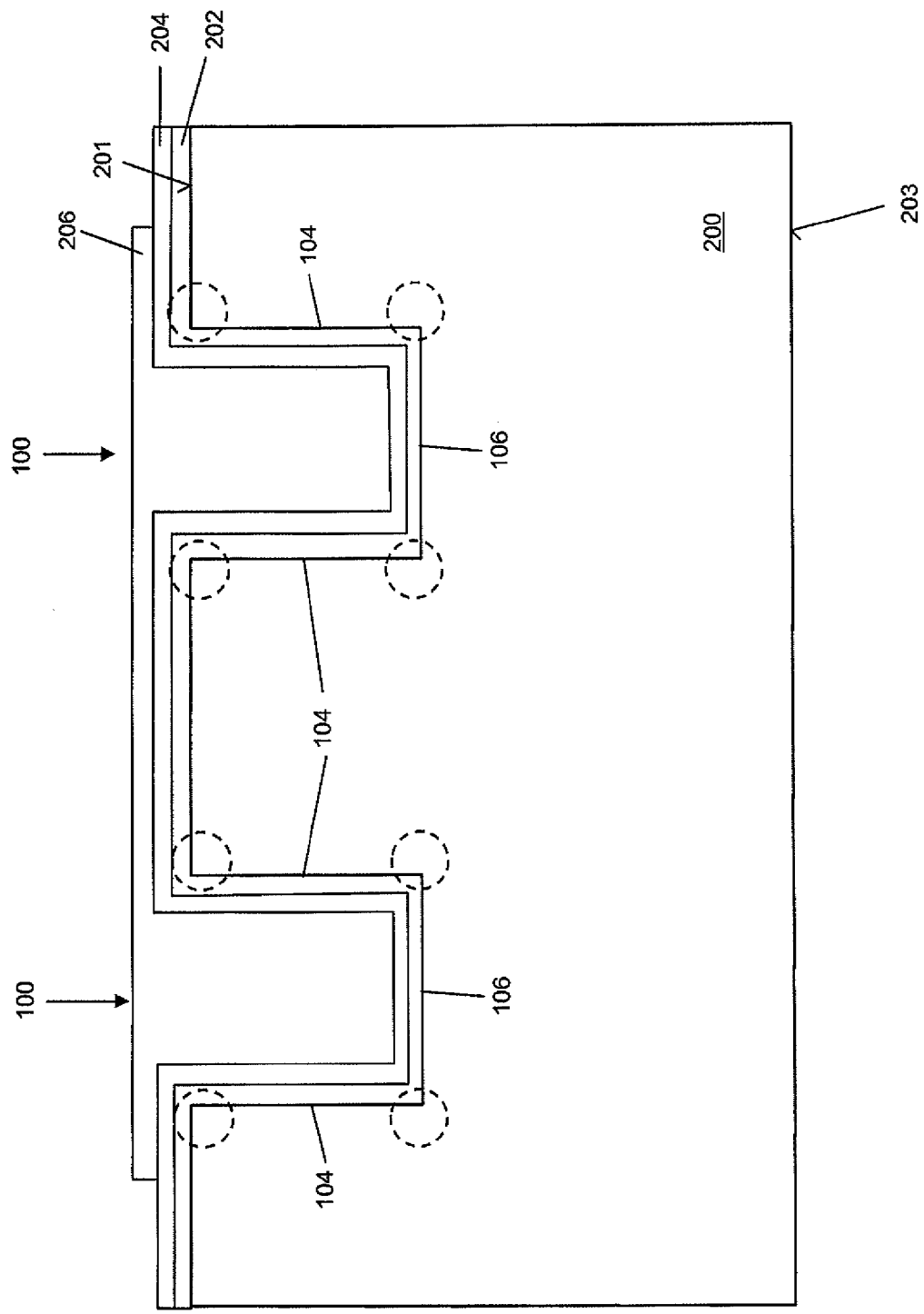

A third region of III-V semiconductor material 206 is then formed in the trenches 100 on the second (barrier) region 204 via any suitable conventional technique e.g. via epitaxy so that the second (barrier) region 204 is interposed between the first (buffer) region 202 and the third (gate) region 206 as shown in FIG. 8. The third (gate) region 206 provides the gate of the transistor. Source and drain regions which are out of view in FIGS. 5-8 can then formed in the trenches 100 with the channel interposed between the source and drain regions in the buffer layer 202 or barrier layer 204 so that the channel has a lateral current flow direction along the sidewalls 104 of the trench 100.

Undefined relationships can be created above and under the trench corners as indicated by the dashed circles in FIG. 8. No 2DEG is formed with a reduced stress. However, a decreased applied voltage is obtained when the stress is increased. Some form of stress compensation is therefore preferred. In one embodiment, one or more of the corner regions are deactivated so that they do not form part of the channel by implanting ions such as helium, hydrogen and iron into the corner region(s). Any suitable conventional technique for implanting such ions can be employed. The implanted ions generate deep interfering locations which deactivate the corresponding corner region(s). Etching can also be employed for stress compensation. The implantation and etching embodiments described herein can be performed outside the corner regions, e.g. on the entire topside 108/201 of the semiconductor body 102/200 and/or on the entire bottom 106 of the trenches 100. Although only the trench sidewalls 104 are then active, the width of the channel is not significantly decreased particularly if large aspect ratio trenches are provided such as trenches having an aspect ratio of about 10:1 or greater.

Figure 9:
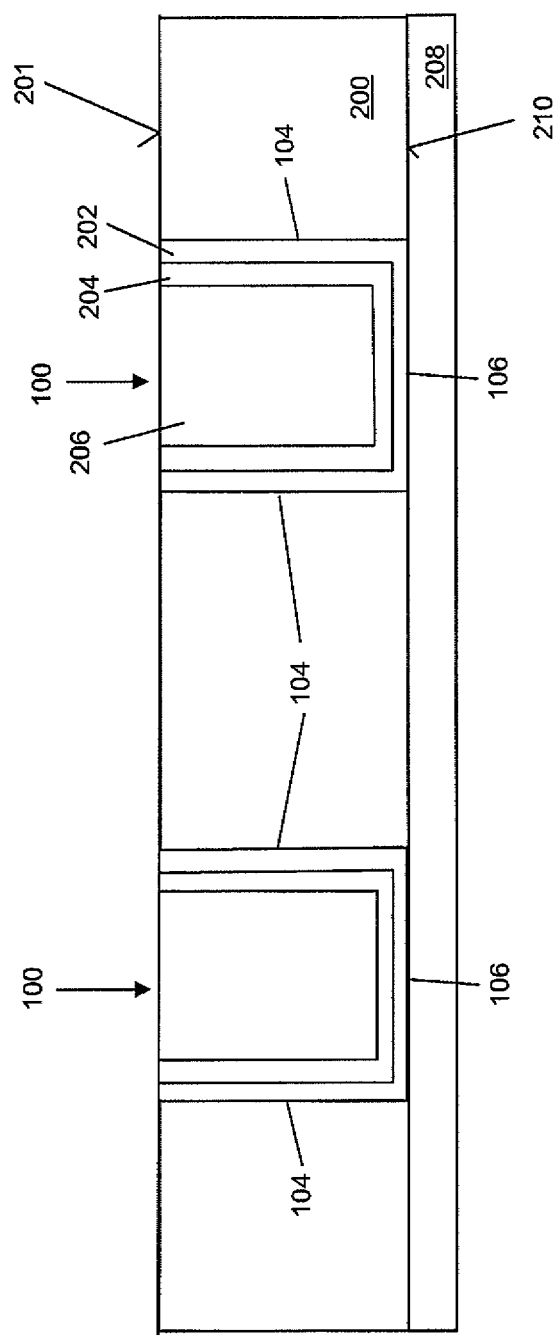
FIG. 9 illustrates a partial schematic cross-sectional view of a lateral HEMT in a trench with stress compensation according to an embodiment.

FIG. 9 illustrates another embodiment for providing stress compensation. According to this embodiment, the backside 203 of the semiconductor substrate 200 is thinned e.g. via etching or CMP (chemical mechanical polishing) and an electrically insulating material 208 is formed on the thinned backside 210 of the semiconductor substrate 200 and adjacent the bottom 106 of the trench 100 so that no portion of the semiconductor substrate 200 is in direct contact with the buffer layer 202 at the bottom 106 of the trenches 100. The buffer, barrier and/or gate layers 202, 204, 206 can also be removed from the topside 201 of the semiconductor substrate 200 as shown in FIG. 9 e.g. via an etching process. Enough of the backside of the semiconductor substrate 200 can be thinned so that at least one of the buffer and barrier layers 202, 204 are removed from the backside at the bottom 106 of the trenches 100.

Figure 10:
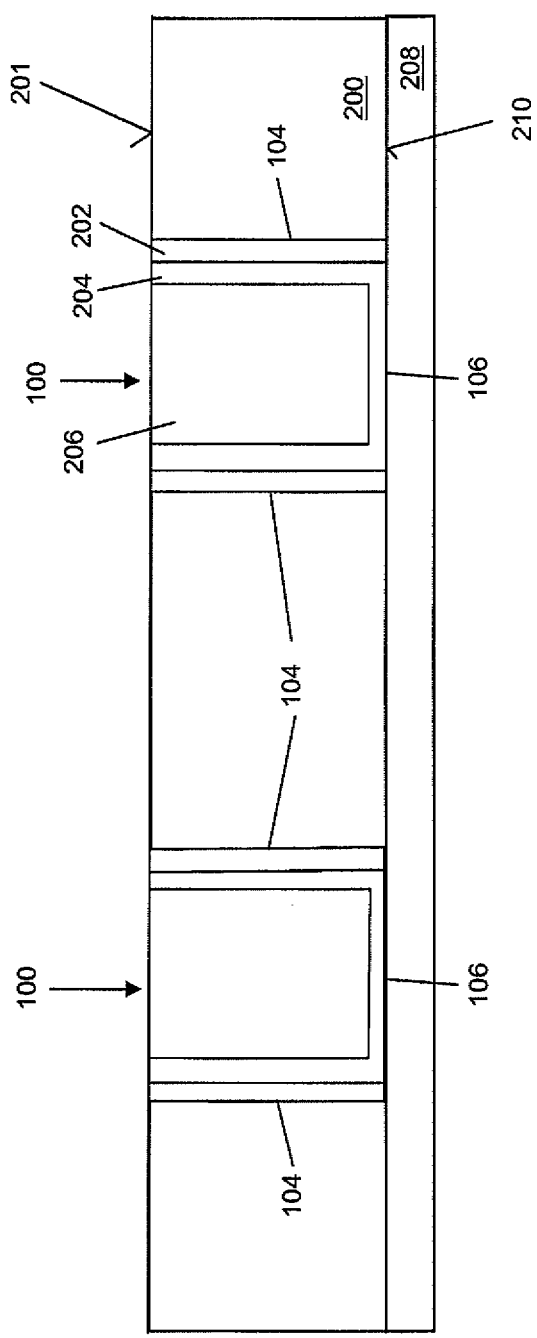
FIG. 10 illustrates a partial schematic cross-sectional view of a lateral HEMT in a trench with stress compensation according to another embodiment.

FIG. 10 illustrates an embodiment where the backside of the semiconductor substrate 200 is thinned until the buffer layer 202 is removed at the bottom 106 of the trenches 100 e.g. by using the barrier layer 204 as an etch stop. According to this embodiment, the barrier layer 204 is interposed between the gate layer 206 and the electrically insulating material 208 formed on the thinned backside 210 of the semiconductor substrate 200.

Figure 11:
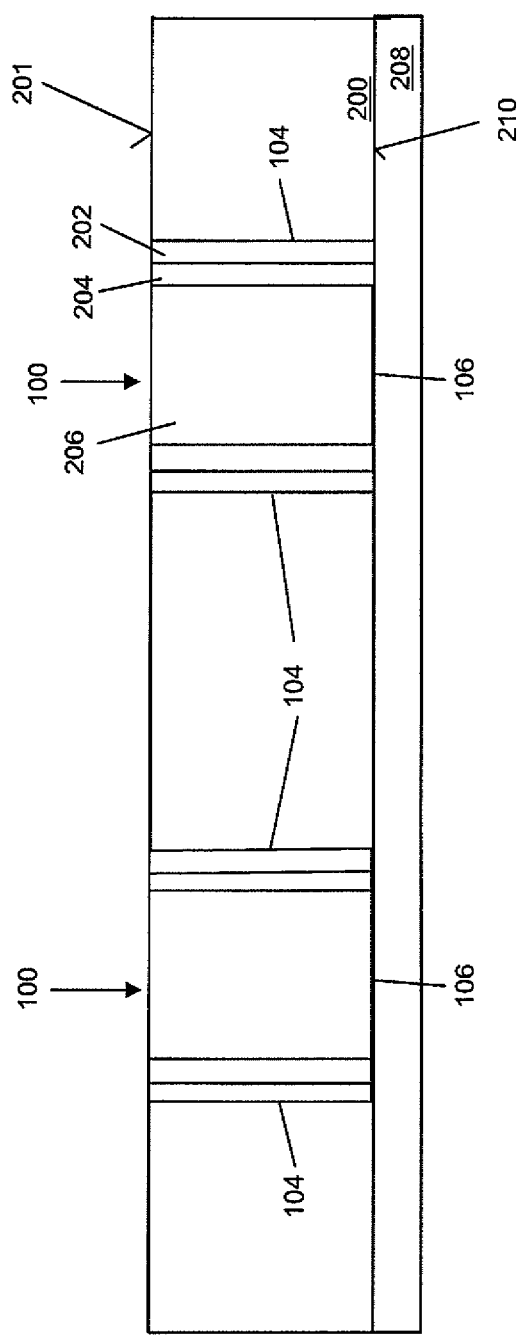
FIG. 11 illustrates a partial schematic cross-sectional view of a lateral HEMT in a trench with stress compensation according to yet another embodiment.

FIG. 11 illustrates another embodiment where the backside of the semiconductor body is thinned until the barrier layer 204 is also removed at the bottom 106 of the trenches 100 e.g. by using the gate layer 206 as an etch stop. According to this embodiment, the gate layer 206 directly contacts the electrically insulating material 208 at the bottom 106 of the trenches 100.

Figure 12:
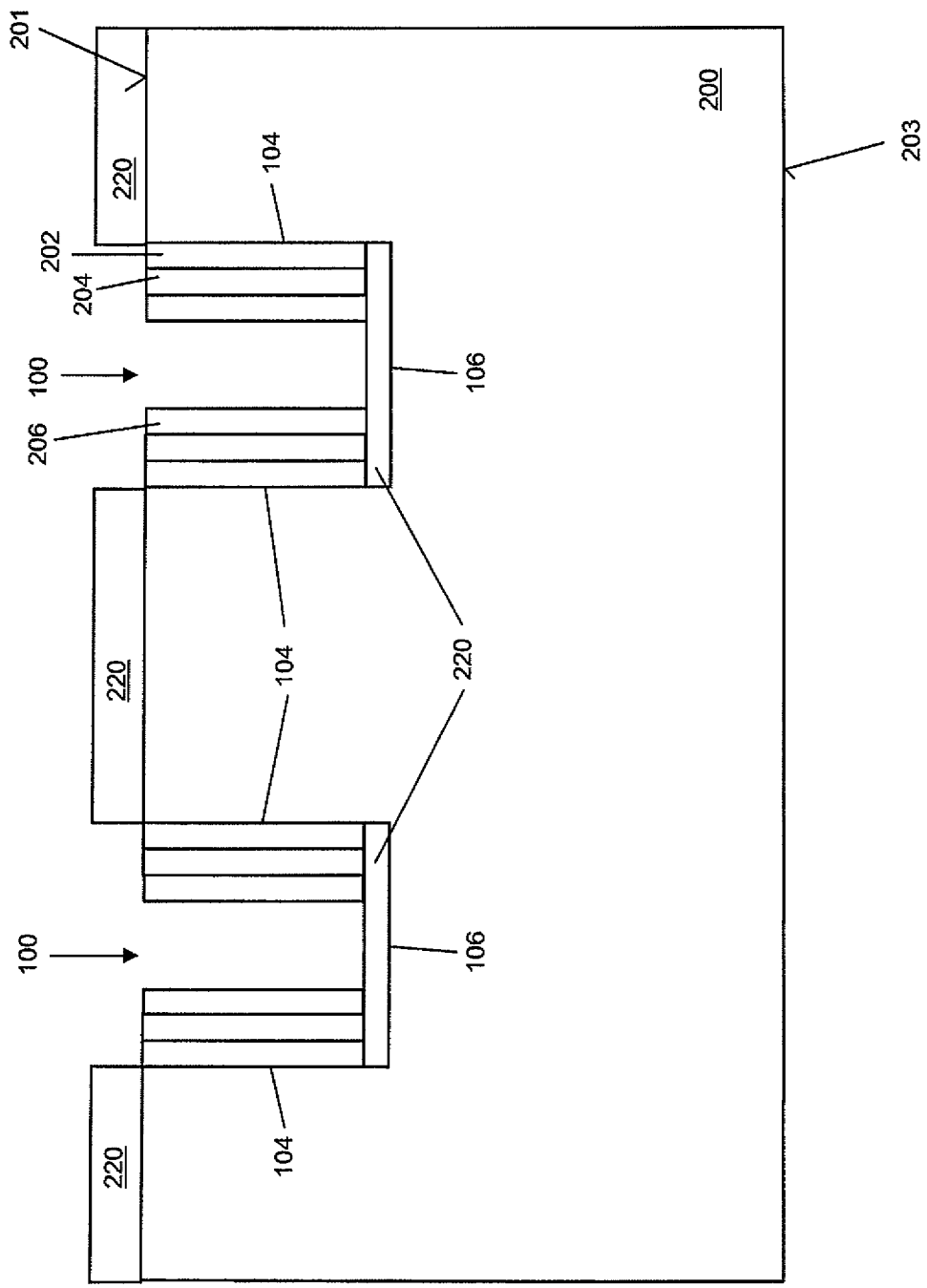
FIG. 12 illustrates a partial schematic cross-sectional view of a lateral HEMT in a trench with stress compensation according to still another embodiment.

FIG. 12 illustrates yet another embodiment for providing stress compensation by using spacer etching or other mask processing. According to this embodiment, a mask 220 is formed on the topside 201 of the semiconductor substrate 200 adjacent the trenches 100 and on the bottom 106 of the trenches 100. The buffer, barrier and gate layers 202, 204, 206 are grown on the sidewalls 104 of the trenches 100 after the mask 220 is formed. In one embodiment, the hard mask used to form the trenches 100 is left on the topside 201 of the semiconductor substrate 200. Additionally, another hard mask region such as an oxide can be formed on the bottom 106 of the trenches 100. The GaN/AlGaN/GaN or other suitable layer stack for forming a MESFET such as an HEMT is then selectively grown on the trench sidewalls 104. The hard mask 220 in the bottom 106 of the trenches 100 can be formed e.g. by filling the trenches, followed by back etching.

Figure 13:
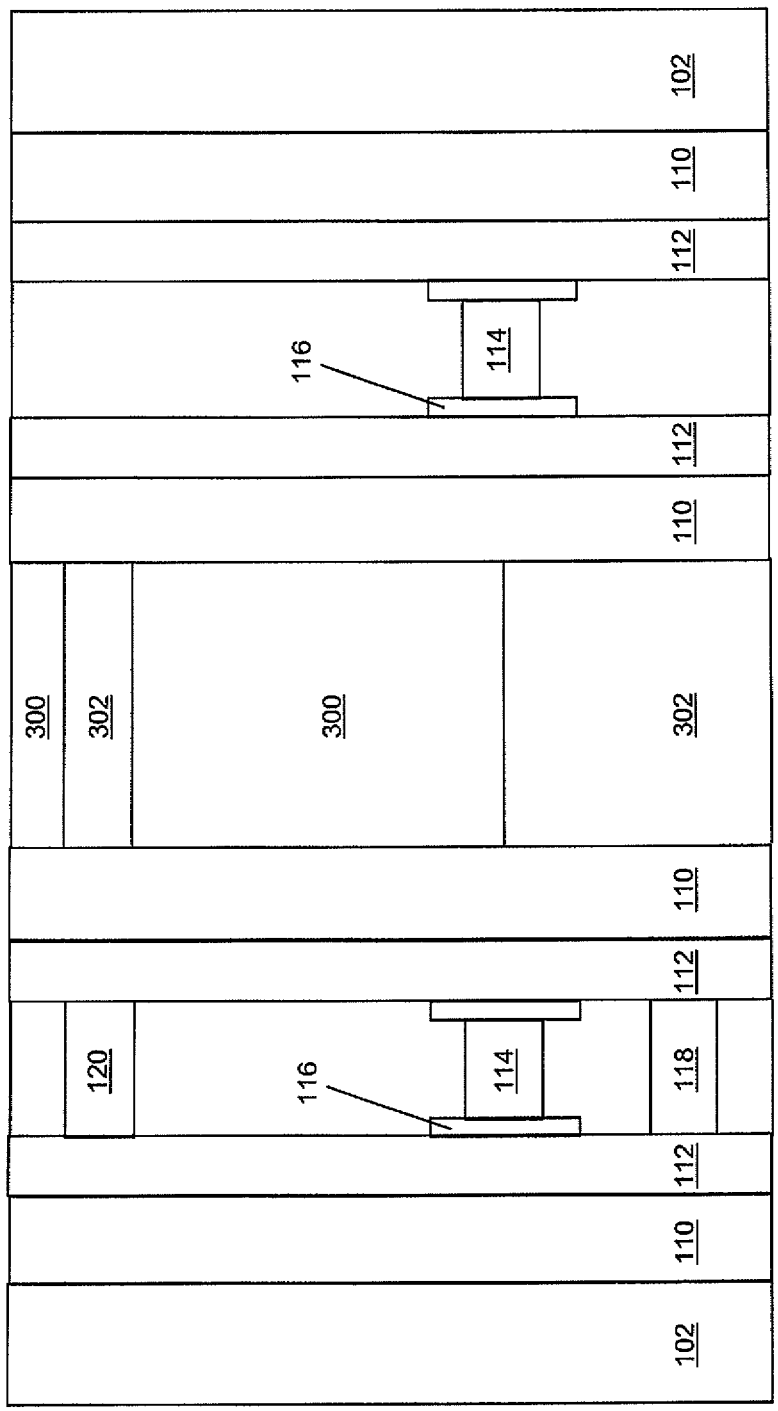
FIG. 13 illustrates a partial schematic plan view of a lateral trench MESFET according to another embodiment.

FIG. 13 illustrates a partial plan view of another embodiment of a normally-off HEMT. According to this embodiment, a region of the semiconductor body laterally disposed between adjacent trenches 100 is removed and replaced with an electrically insulating material 300, leaving mesas (islands) of semiconductor material 302 laterally surrounded by the trenches 100 and the insulating material 300. The mesas 302 can be etched away only partially and filled with a dielectric. In one embodiment, the semiconductor body 102 is replaced with the electrically insulating material 300 only in the region of the drift path. Alternatively, the electrically insulating material 300 is provided directly adjacent to the buffer (e.g. GaN) layers 110 with the center part of the mesas 302 remaining in tact. In yet another embodiment, the semiconductor body 102 is removed only in the region of the drift zone 122 with the remaining semiconductor mesas 302 disposed adjacent the drain and source regions 118, 120 of the device. The semiconductor mesa regions 302, which limit the voltage, can be fully removed at least in the region of the drift zone 122, so that no reduction of the blocking resistance due to the semiconductor substrate material 102 occurs even with relatively thin GaN layers 110. The mesas 302 also provide mechanical stabilization and isolation, and can be placed on an existing potential such as a source or drain potential.

Figure 14:
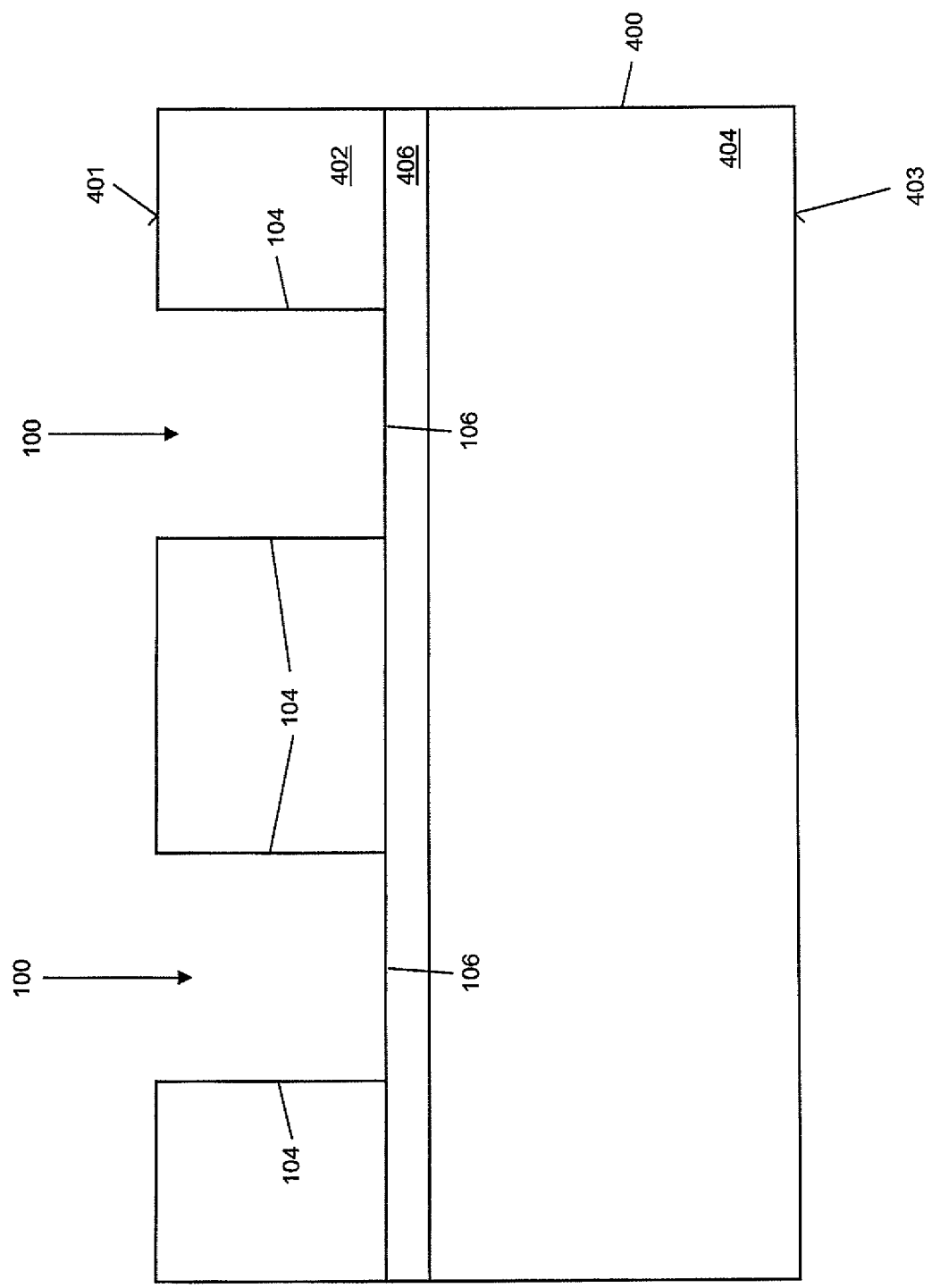
FIGS. 14-18 illustrate another embodiment of a method of manufacturing a lateral HEMT in a trench.

FIGS. 14-18 illustrate another embodiment of a method for manufacturing a lateral HEMT in a trench. The substrate 400 is an SOI substrate according to this embodiment. The SOI substrate 400 has a device region 402 separated from a bulk region 404 by an insulator layer 406, the device region 402 being where the devices are fabricated. Trenches 100 are formed in the device region 402 of the SOI substrate 400 with the bottom 106 of the trenches 100 contacting the insulator layer 406 of the SOI substrate 400 as shown in FIG. 14.

Figure 15:
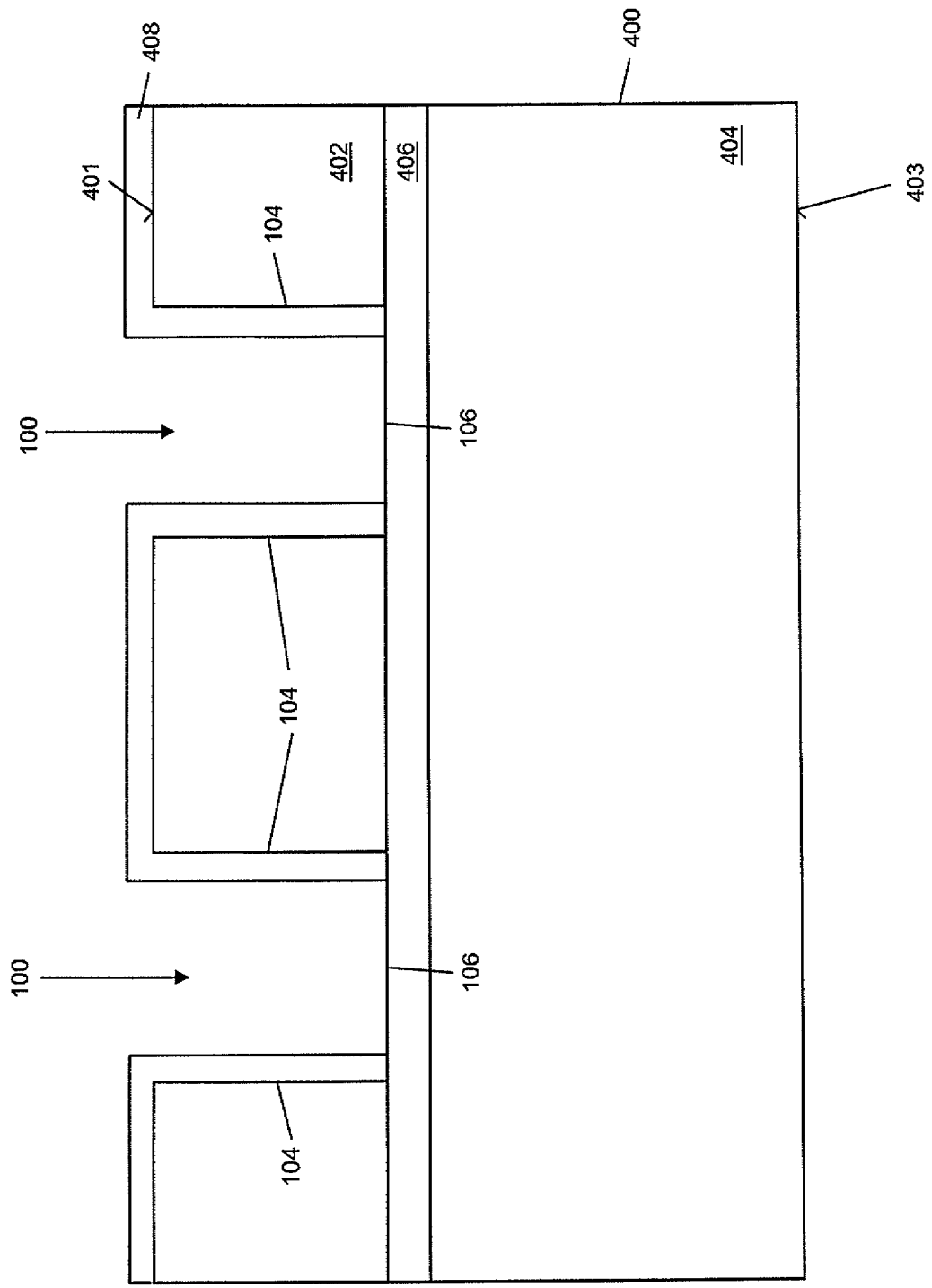
Figure 16:
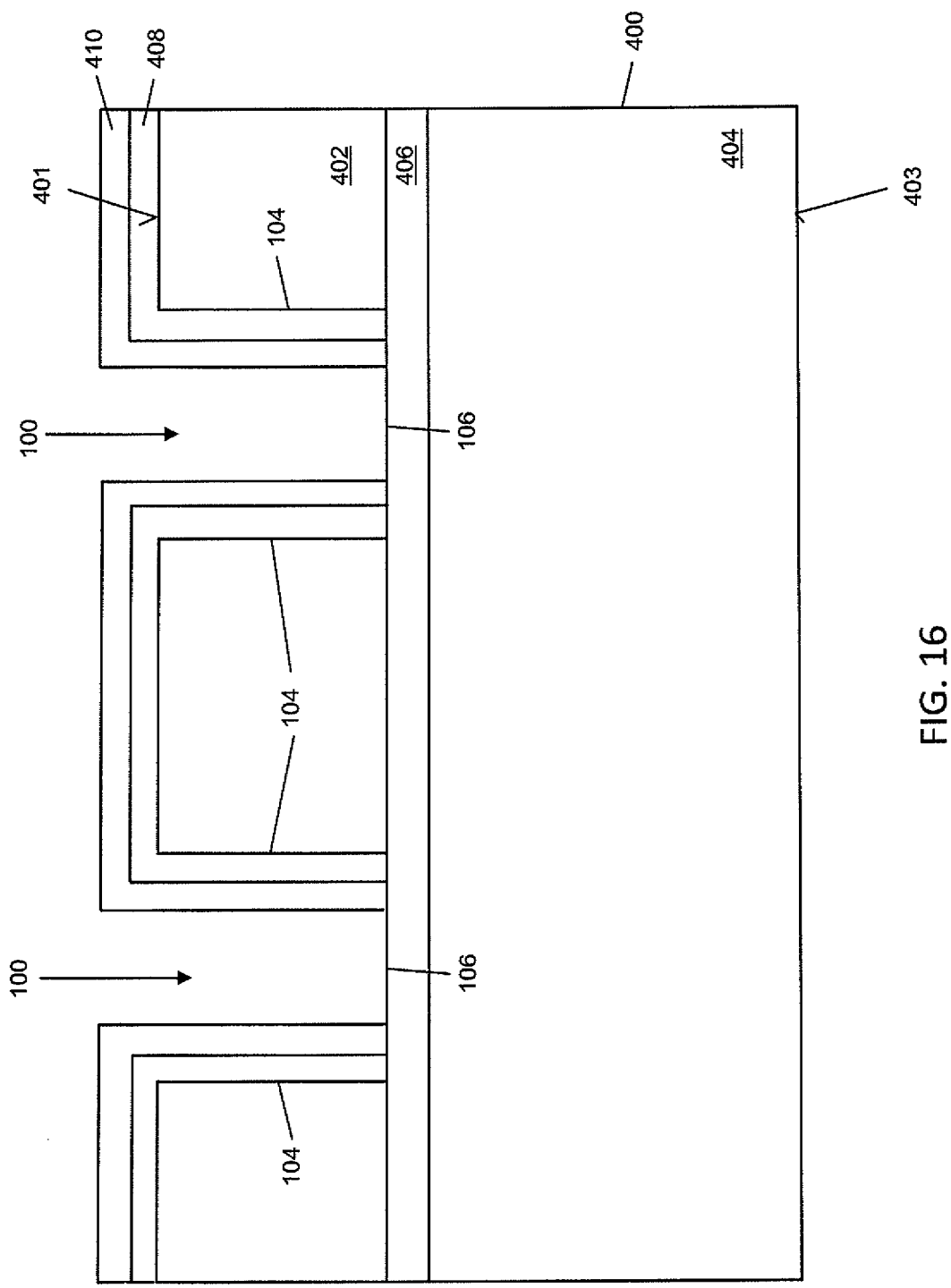

A first region of III-V semiconductor material 408 such as GaN is formed in the trench 100 along the sidewalls 104 and bottom 106, and on the topside 401 of the SOI substrate 400 as shown in FIG. 15. The first region of III-V semiconductor material 408 forms the buffer layer and can include the channel of the HEMT. The first region of III-V semiconductor material 408 can be formed via any suitable conventional technique e.g. via heteroepitaxy on a compatible substrate such as Si, sapphire, GaN or SiC. A second region of III-V semiconductor material 410 such as AlGaN or InAlN is then formed in the trenches 100 on the first (buffer) region 408 via any suitable conventional technique e.g. via epitaxy as shown in FIG. 16. The second region 410 forms the barrier layer of the HEMT which supplies charge for the 2DEG in the channel. The second (barrier) region 410 has a different band gap than the first (buffer) region 408.

Figure 17:
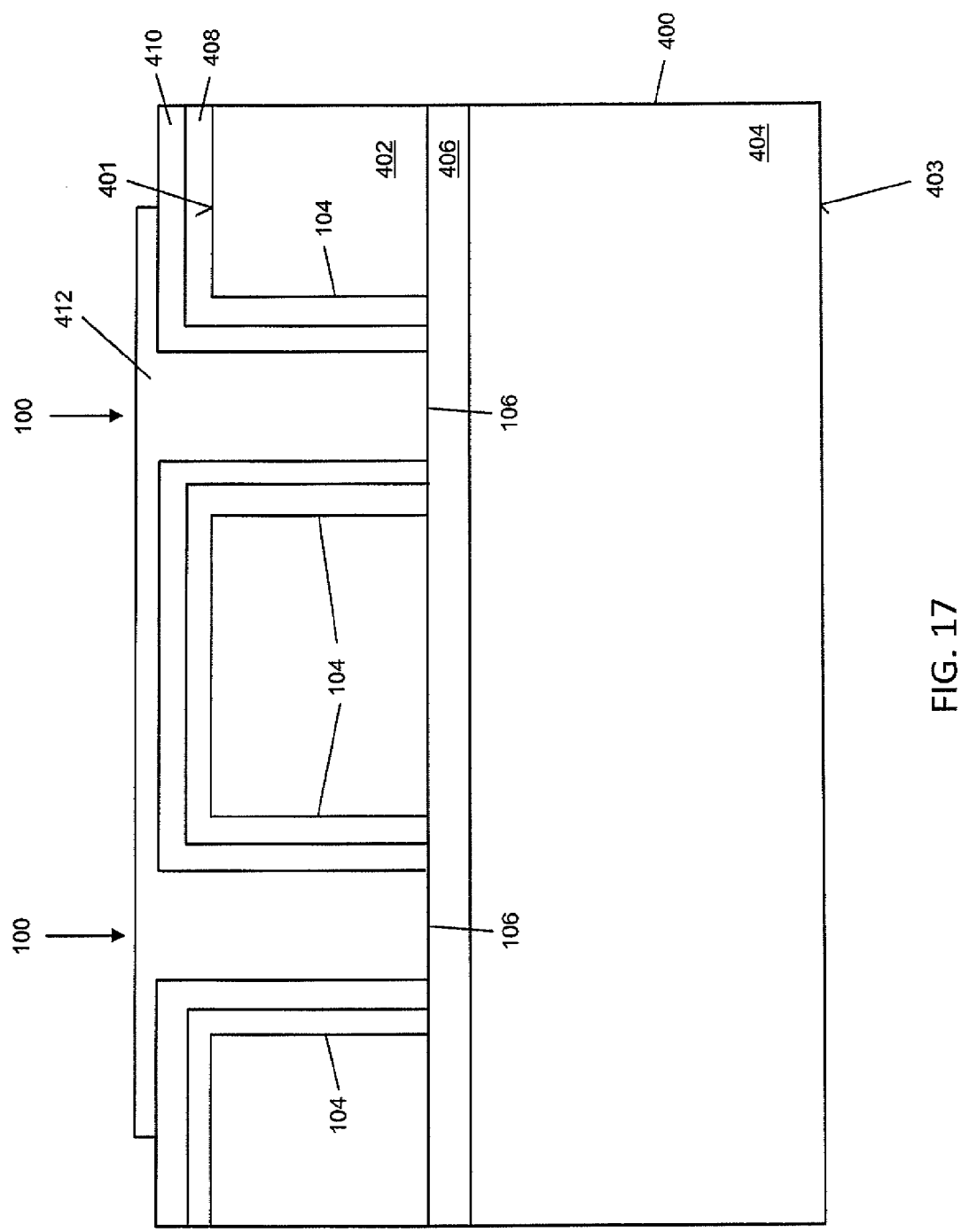

A third region of III-V semiconductor material 412 is then formed in the trenches 100 on the second (barrier) region 410 via any suitable conventional technique e.g. via epitaxy so that the second (barrier) region 410 is interposed between the first (buffer) region 408 and the third (gate) region 412 as shown in FIG. 17. The third (gate) region 412 provides the gate of the transistor. Source and drain regions which are out of view in FIG. 17 are formed in the trenches 100 with the channel interposed between the source and drain regions in the buffer layer 408 or barrier layer 410 so that the channel has a lateral current flow direction along the sidewalls 104 of the trenches 100. With the SOI substrate 400, the 2DEG is insulated below by the buried insulator layer 406. A thermal connection to the substrate 400 can be achieved for example with metallic contacts of the source and/or drain. The bulk region 404 of the SOI substrate 400 can be removed e.g. by etching the backside 403 or with CMP to thin the device if desired.

Figure 18:
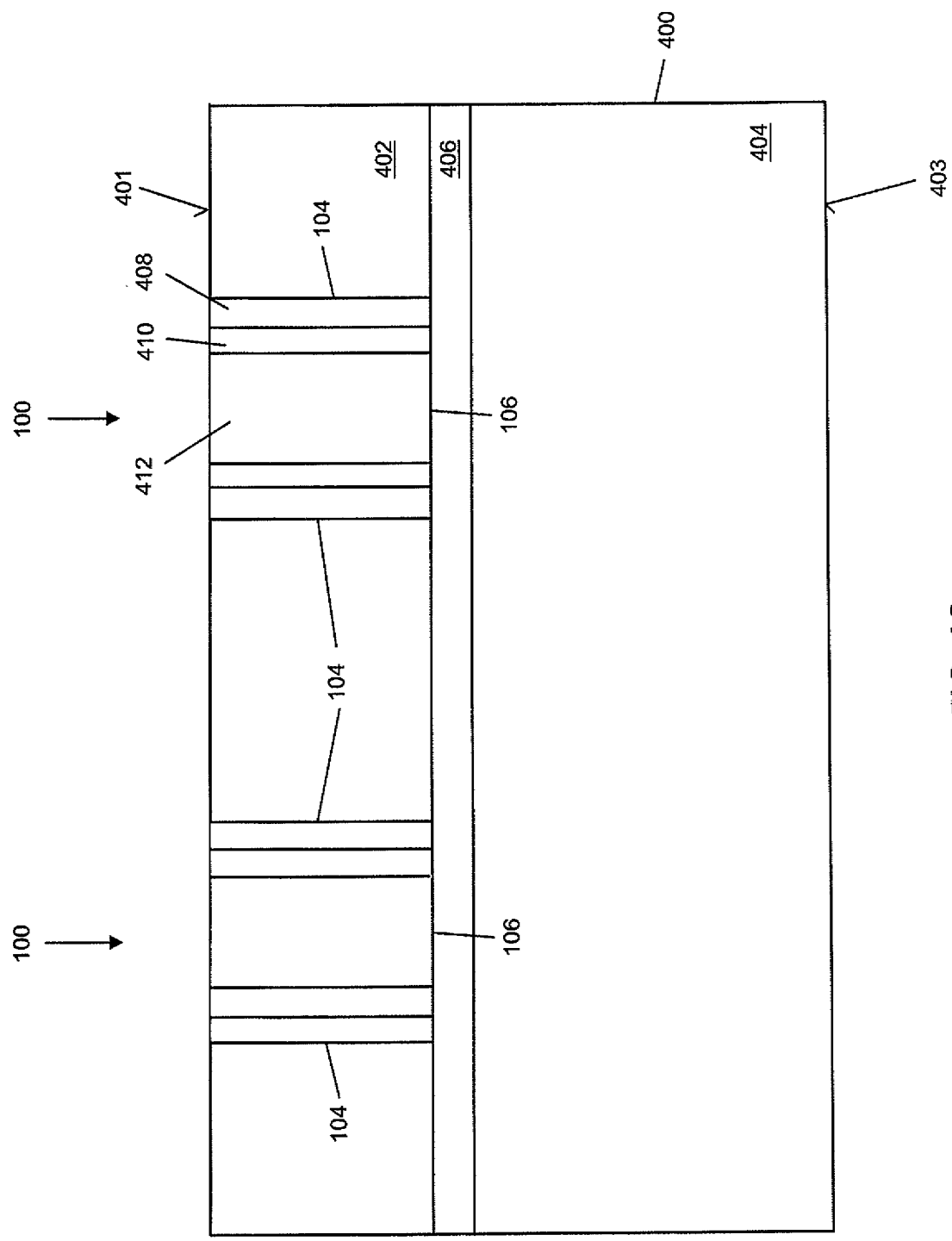

The gate, barrier and/or buffer layers 412, 410, 408 can be removed from the topside 401 of the SOI substrate 400 to provide stress compensation as previously described herein and as shown in FIG. 18. Alternatively, one or more of the upper corner regions can be deactivated by implanting ions such as helium, hydrogen and iron into the corner region(s) also as previously described herein. In yet another embodiment, spacer etching or other mask processing can be used to grow the buffer, barrier and gate layers 408, 410, 412 only on the sidewalls 104 of the trenches 100 as previously explained herein and as shown in FIG. 12. Regions of the active device layer 402 of the SOI substrate 400 can be removed and replaced with an insulating material as previously described herein and as shown in FIG. 13. In one embodiment, Si mesa regions, which limit the voltage, are fully removed at least in the region of the drift zone 122, so that no reduction of the blocking resistance due to the active device region material occurs even with relatively thin GaN layers 408.

Figure 19A:
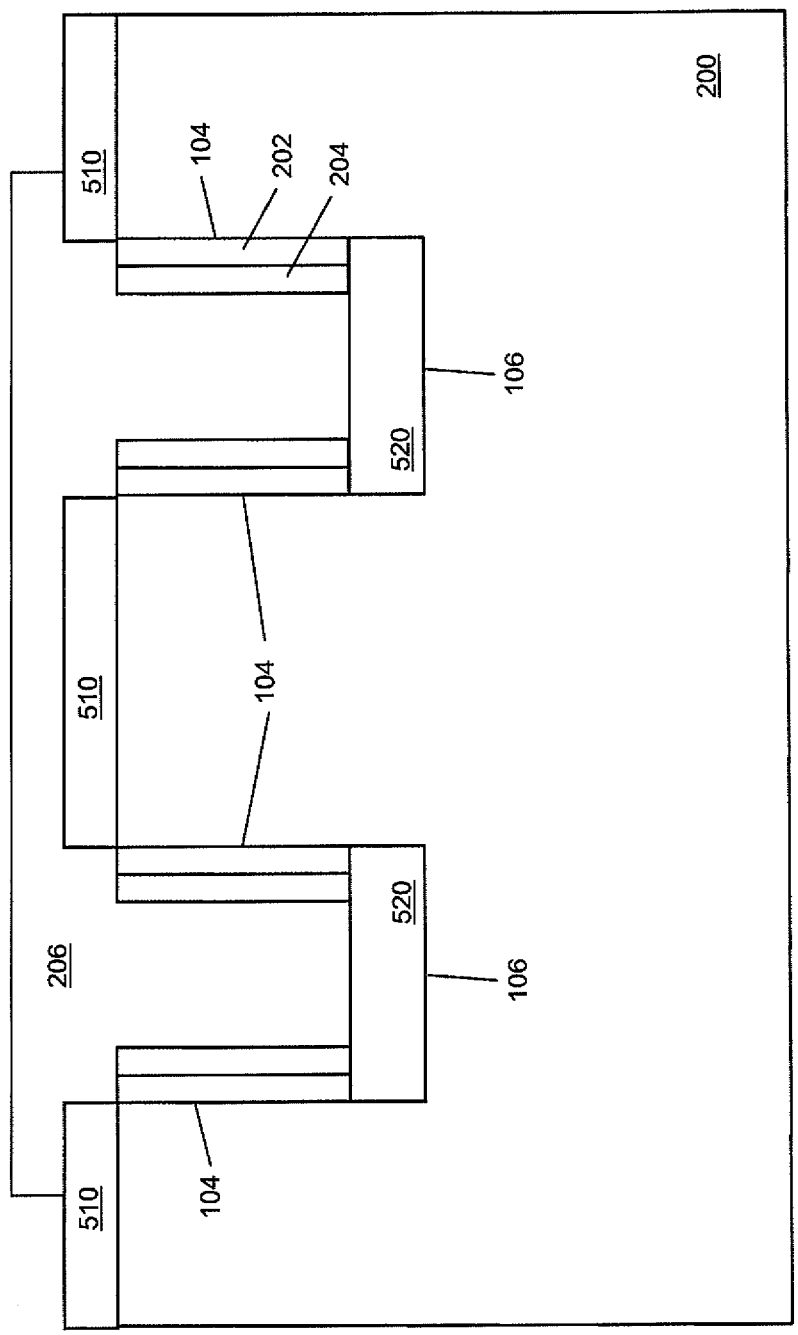
FIGS. 19A and 19B illustrate a partial schematic cross-sectional view of a lateral trench MESFET according to another embodiment.

FIG. 19A illustrates a cross-sectional view of another embodiment of a MESFET such as a normally-off HEMT in the gate region. According to this embodiment, the normally-off HEMT is manufactured on a bulk semiconductor substrate 200 such as a Si wafer instead of an SOI substrate. The buffer layer 202 (e.g. GaN) is disposed along the trench sidewalls 104 and the barrier layer 204 (e.g. AlGaN or InAlN) is disposed on the buffer layer 202. The gate material 206 is disposed in the trenches on the barrier layer 204 and on the upper surface of the substrate 200 in the gate region as shown in FIG. 19A. As such, the barrier layer 204 is interposed between the buffer layer 202 and the gate material 206 as previously described herein.

A trench hard mask 510 which is formed on the top surface of the substrate 200 to form trenches in the substrate 200, insulates the gate material 206 from the substrate 200. An oxidation or oxide deposition step is performed and the oxide is etched back, leaving an oxide 520 in the bottom 106 of the trenches which is thick enough to withstand the maximum rated voltage of the device. The oxide 520 remaining in the trench bottoms 106 can also be used to prevent the growth of GaN layers at this surface. The source and drain regions which are out of view in FIG. 19A can then formed in the trenches with the channel interposed between the source and drain regions in the buffer layer 202 or barrier layer 204 so that the channel has a lateral current flow direction along the trench sidewalls 104.

Figure 19B:
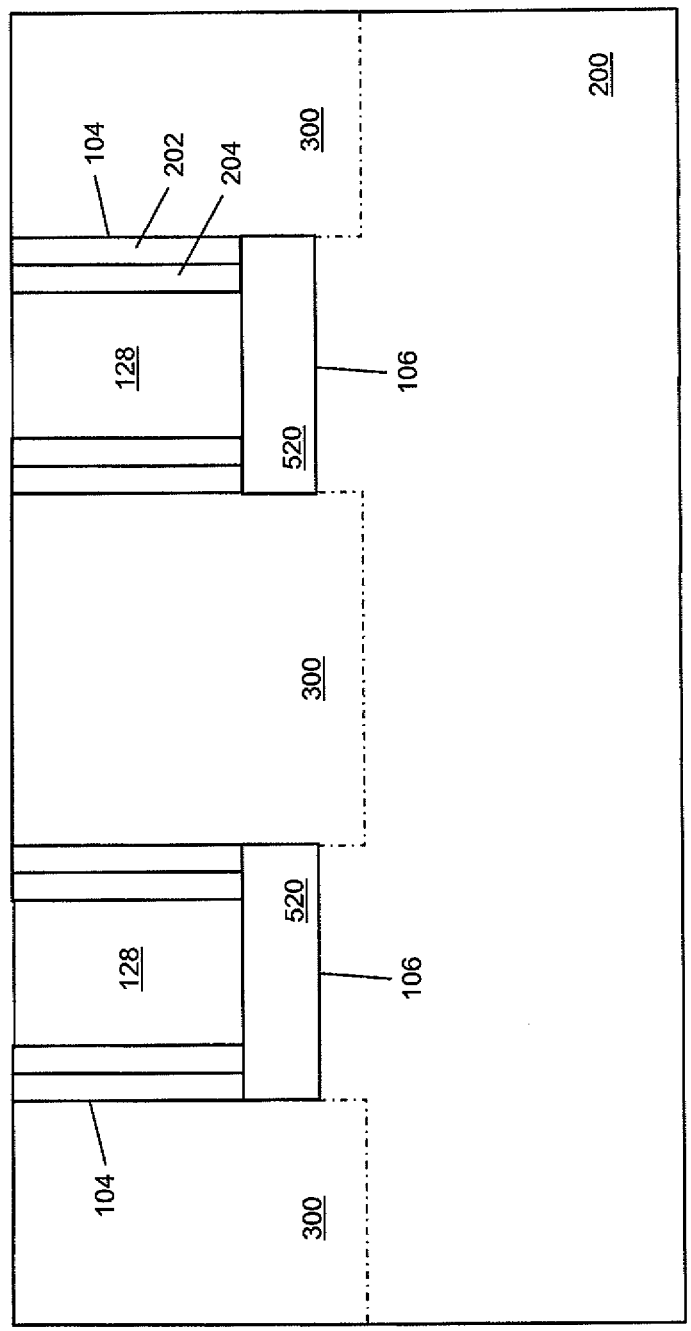

FIG. 19B is a cross-sectional view of the MESFET in the drain extension region. The thick oxide 520 in the trench bottoms 106 in combination with the electrically insulating material 300 between adjacent trenches prevents a short with the source via the semiconductor body 200.

Figure 20:
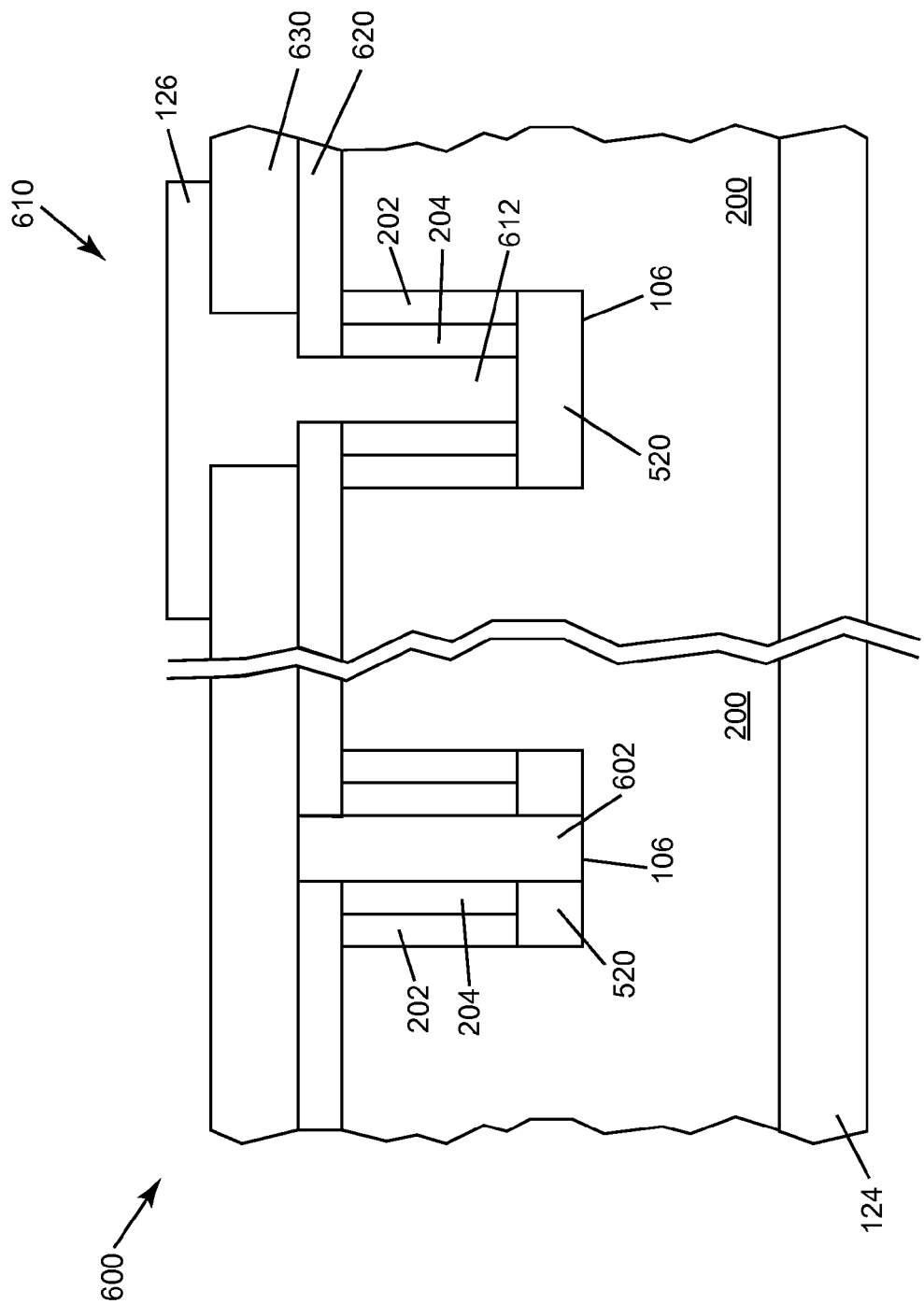
FIG. 20 illustrates a partial schematic cross-sectional view of the source and drain electrode regions of a lateral trench MESFET according to an embodiment.

FIG. 20 illustrates a cross-sectional view of an embodiment of the source and drain electrode regions 600, 610 of the MESFETs described herein. According to this embodiment, the source and drain electrodes 124, 126 are disposed at opposing sides of the substrate 200 and therefore are offset vertically to the lateral current flow. The source electrode 124 is disposed at one side of the substrate 200 and electrically connected to a conductive material 602 in the trench through the substrate 200 and an opening in the bottom trench oxide 520 in the source electrode region 600 of the device. The bottom trench oxide 520 is continuous in the drain electrode region 610 of the device so that the drain electrode 126 is isolated from the substrate 200. The drain electrode 126 is disposed at the opposite side of the substrate 200 as the source electrode 124, and is electrically connected to a conductive material 612 in the trench through and an opening in one or more insulating layers 620, 630 disposed at this side of the substrate 200 in the drain electrode region 612 of the device. A contact processed from the backside is also possible. The position of the source and drain electrodes 124, 126 can be reversed. That is, the source electrode 124 can be disposed on the top side of the device and the drain electrode 126 can be disposed on the bottom side.

According to the embodiments described herein, an increased channel width is provided for a lateral MESFET such as an HEMT with the increased channel width being along to the sidewalls of a trench, in particular by removing the Si mesa, which serves as a substrate for the GaN growth, and replacing it with a dielectric.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor, comprising:
   a trench formed in a semiconductor body, the trench having sidewalls and a bottom;
   a first semiconductor material disposed in the trench adjacent the sidewalls;
   a second semiconductor material disposed in the trench and spaced apart from the sidewalls by the first semiconductor material, the second semiconductor material having a different band gap than the first semiconductor material;
   a gate material disposed in the trench and spaced apart from the first semiconductor material by the second semiconductor material, the gate material providing a gate of the transistor; and
   source and drain regions arranged in the trench with a channel interposed between the source and drain regions in the first or second semiconductor material so that the channel has a lateral current flow direction along the sidewalls of the trench;
   wherein a corner region of the trench is implanted so that the corner region is deactivated and the channel is not formed in the corner region.

2. The transistor of claim 1, wherein the semiconductor body comprises silicon and the sidewalls of the trench have a (111) surface.

3. The transistor of claim 1, further comprising an electrically insulating material disposed on a bottom surface of the semiconductor body and adjacent the bottom of the trench.

4. The transistor of claim 3, wherein the gate material directly contacts the electrically insulating material at the bottom of the trench.

5. The transistor of claim 1, wherein the gate material is spaced apart from the bottom of the trench by at least one of the first and second semiconductor materials.

6. The transistor of claim 1, further comprising source, drain and gate electrodes, wherein the source and drain electrodes are disposed on the same side of the semiconductor body.

7. The transistor of claim 1, wherein a region of the semiconductor body laterally adjacent the trench is replaced with an electrically insulating material.

8. The transistor of claim 1, wherein a first mesa region of the semiconductor body adjacent the drain region is narrower than a second mesa region of the semiconductor body adjacent the source region, the mesa regions being separated by the electrically insulating material.

9. The transistor of claim 1, wherein the region of the semiconductor body replaced with the electrically insulating material is adjacent a drift zone disposed in the trench between the source and drain regions.

10. The transistor of claim 1, wherein the corner region is implanted with at least one of helium, hydrogen and iron to deactivate the corner region.

11. The transistor of claim 1, wherein the semiconductor body is a silicon-on-insulator substrate having a device region separated from a bulk region by an insulator layer, the trench is formed in the device region of the silicon-on-insulator substrate and the bottom of the trench contacts the insulator layer of the silicon-on-insulator substrate.

12. The transistor of claim 1, wherein the semiconductor body comprises a silicon substrate, the first semiconductor material comprises GaN, the second semiconductor material comprises AlGaN and the gate material comprises AlGaN.

13. The transistor of claim 1, further comprising an insulating material disposed at the bottom of the trench which is thick enough to withstand a maximum rated voltage of the transistor, wherein the first and second semiconductor materials are spaced apart from the semiconductor body at the bottom of the trench by the insulating material.

14. A transistor, comprising:
    a trench formed in a semiconductor body, the trench having sidewalls and a bottom;
    a first semiconductor material disposed in the trench adjacent the sidewalls;
    a second semiconductor material disposed in the trench and spaced apart from the sidewalls by the first semiconductor material, the second semiconductor material having a different band gap than the first semiconductor material;
    a gate material disposed in the trench and spaced apart from the first semiconductor material by the second semiconductor material, the gate material providing a gate of the transistor;
    source and drain regions arranged in the trench with a channel interposed between the source and drain regions in the first or second semiconductor material so that the channel has a lateral current flow direction along the sidewalls of the trench; and
    an insulating material disposed at the bottom of the trench which is thick enough to withstand a maximum rated voltage of the transistor, wherein the first and second semiconductor materials are spaced apart from the semiconductor body at the bottom of the trench by the insulating material.

15. The transistor of claim 14, wherein the semiconductor body comprises silicon and the sidewalls of the trench have a (111) surface.

16. The transistor of claim 14, further comprising source, drain and gate electrodes, wherein the source and drain electrodes are disposed on the same side of the semiconductor body.

17. The transistor of claim 14, wherein a region of the semiconductor body laterally adjacent the trench is replaced with an electrically insulating material.

18. The transistor of claim 17, wherein a first mesa region of the semiconductor body adjacent the drain region is narrower than a second mesa region of the semiconductor body adjacent the source region, the mesa regions being separated by the electrically insulating material.

19. The transistor of claim 18, wherein the region of the semiconductor body replaced with the electrically insulating material is adjacent a drift zone disposed in the trench between the source and drain regions.

20. The transistor of claim 14, wherein one or more corner regions of the trench are deactivated.

21. The transistor of claim 20, wherein the one or more corner regions of the trench are deactivated with at least one of implanted helium, hydrogen and iron.

22. The transistor of claim 14, wherein the semiconductor body is a silicon-on-insulator substrate having a device region separated from a bulk region, wherein the insulating material is an insulator layer of the silicon-on-insulator substrate, the trench is formed in the device region of the silicon-on-insulator substrate and the bottom of the trench contacts the insulating material.

23. The transistor of claim 14, wherein the semiconductor body comprises a silicon substrate, the first semiconductor material comprises GaN, the second semiconductor material comprises AlGaN and the gate material comprises AlGaN.

* * * * *